(12) United States Patent
Sheldon et al.

(10) Patent No.: US 10,726,171 B2
(45) Date of Patent: Jul. 28, 2020

(54) SYSTEM AND METHOD FOR CALCULATING REMAINING USEFUL LIFE OF A COMPONENT

(71) Applicant: SIKORSKY AIRCRAFT CORPORATION, Stratford, CT (US)

(72) Inventors: Jeremy Sheldon, Henrietta, NY (US); David Kasper, Shelton, CT (US); Garrett Argenna, Rochester, NY (US)

(73) Assignee: SIKORSKY AIRCRAFT CORPORATION, Stratford, CT (US)

( * ) Notice: Subject to any disclaimer, the term of this patent is extended or adjusted under 35 U.S.C. 154(b) by 325 days.

(21) Appl. No.: 15/567,498

(22) PCT Filed: Mar. 3, 2016

(86) PCT No.: PCT/US2016/020636
§ 371 (c)(1),
(2) Date: Oct. 18, 2017

(87) PCT Pub. No.: WO2016/178736
PCT Pub. Date: Nov. 10, 2016

(65) Prior Publication Data
US 2018/0096084 A1  Apr. 5, 2018

Related U.S. Application Data

(60) Provisional application No. 62/156,379, filed on May 4, 2015.

(51) Int. Cl.
*G07C 5/08*     (2006.01)
*G06F 30/20*    (2020.01)
(Continued)

(52) U.S. Cl.
CPC ............. *G06F 30/20* (2020.01); *B64D 45/00* (2013.01); *G05B 23/0283* (2013.01);
(Continued)

(58) Field of Classification Search
CPC . F03D 7/047; G05B 23/0251; G05B 23/0245; G01N 3/00; G01N 27/5046; B64D 45/00; F01D 17/02
(Continued)

(56) References Cited

U.S. PATENT DOCUMENTS 5,210,704 A   5/1993  Husseiny
7,328,128 B2  2/2008  Bonanni et al.
(Continued)

OTHER PUBLICATIONS

Bolander et al., "Physics based remaining useful life prediction for aircraft engine bearing prognosis" Prognostics and Health Management Society, 2009.*
(Continued)

*Primary Examiner* — Kandasamy Thangavelu
(74) *Attorney, Agent, or Firm* — Cantor Colburn LLP

(57) ABSTRACT

A system and method for determining a remaining useful life of a component, includes providing a usage and configuration information associated with the component, determining if a preexisting spall condition exists for the component, executing a spall initiation model for the component if the preexisting spall condition does not exist, wherein the spall initiation model provides a spall initiation life associated with the component by analyzing the usage and configuration information, executing a spall propagation model for the component, wherein the spall propagation model provides a spall propagation life associated with the component by analyzing the usage and configuration information, and providing a remaining useful life by integrating the spall initiation life and the spall propagation life.

15 Claims, 2 Drawing Sheets

(51) Int. Cl.
*G06Q 10/00* (2012.01)
*G05B 23/02* (2006.01)
*B64D 45/00* (2006.01)

(52) U.S. Cl.
CPC ........... *G06Q 10/20* (2013.01); *G07C 5/0808* (2013.01); *B64D 2045/0085* (2013.01)

(58) Field of Classification Search
USPC .......................................................... 703/6
See application file for complete search history.

(56) References Cited

U.S. PATENT DOCUMENTS

| | | | |
|---|---|---|---|
| 7,824,147 B2 | 11/2010 | Morris et al. | |
| 2007/0198215 A1* | 8/2007 | Bonanni | G05B 23/0251 702/183 |
| 2009/0276166 A1 | 11/2009 | Wang et al. | |
| 2010/0116062 A1* | 5/2010 | Sato | G01N 3/00 73/799 |
| 2011/0125419 A1* | 5/2011 | Bechhoefer | F03D 7/047 702/34 |
| 2011/0137575 A1* | 6/2011 | Koul | G05B 23/0245 702/34 |
| 2011/0241661 A1* | 10/2011 | Nomura | G01N 27/9046 324/239 |
| 2012/0283963 A1* | 11/2012 | Mitchell | F01D 17/02 702/34 |
| 2014/0107948 A1 | 4/2014 | Amann et al. | |
| 2014/0163904 A1 | 6/2014 | Bechhoefer et al. | |
| 2014/0244133 A1 | 8/2014 | De Prosperis et al. | |
| 2015/0039244 A1 | 2/2015 | Bernstein | |
| 2015/0274315 A1* | 10/2015 | Conrad | B64D 45/00 701/31.9 |

OTHER PUBLICATIONS

European Search Report; European Application No. 16789712.3-1204/3292380 PCT/US2016020636; Nov. 21, 2018; 8 pages.
PCT/US2016/020636—ISR/WO, Issued May 20, 2016, 13 pages.

* cited by examiner

SYSTEM AND METHOD FOR CALCULATING REMAINING USEFUL LIFE OF A COMPONENT

CROSS REFERENCE TO RELATED APPLICATIONS

This application is a National Stage application of PCT/US2016/020636, filed Mar. 3, 2016, which claims the benefit of U.S. Provisional Application No. 62/156,379, filed May 4, 2015, both of which are incorporated by reference in their entirety herein.

STATEMENT REGARDING FEDERALLY SPONSORED RESEARCH AND DEVELOPMENT

This invention was made with government support with the United States Army under Contract No. W911W6-10-2-0006. The government therefore has certain rights in this invention.

DESCRIPTION OF RELATED ART

The subject matter disclosed herein relates to component prognostics, and to a system and a method for predicting a remaining useful life of system components, particularly for use with an aircraft.

Typically, components of an aircraft, e.g. a helicopter, are desired to be monitored and replaced prior to failure. For example, important mechanical drive system components including bearings and gears may experience damage initiation and propagation as the components wear.

Scheduled maintenance of mechanical drive system components or metallic chip based detection is often used to provide a replacement schedule for components. These solutions can result in components that are replaced too early or a grounded aircraft due to components overdue for service or replacement. A system and method that can provide a remaining useful life to minimize maintenance burden while ensuring safety and reliability is desired.

BRIEF SUMMARY

According to an embodiment, a method for determining a remaining useful life of a component, includes providing a usage and configuration information associated with the component, determining if a preexisting spall condition exists for the component, executing a spall initiation model for the component if the preexisting spall condition does not exist, wherein the spall initiation model provides a spall initiation life associated with the component by analyzing the usage and configuration information, executing a spall propagation model for the component, wherein the spall propagation model provides a spall propagation life associated with the component by analyzing the usage and configuration information, providing a remaining useful life by integrating the spall initiation life and the spall propagation life.

In addition to one or more of the features described above, or as an alternative, further embodiments could include that at least one of the spall initiation model and the spall propagation model provides a spall distribution characteristic and a spall size trend characteristic.

In addition to one or more of the features described above, or as an alternative, further embodiments could include that the spall propagation life is determined when the spall distribution characteristic exceeds a threshold spall distribution characteristic.

In addition to one or more of the features described above, or as an alternative, further embodiments could include providing an uncertainty range for the remaining useful life.

In addition to one or more of the features described above, or as an alternative, further embodiments could include calculating the uncertainty range from the usage and configuration information.

In addition to one or more of the features described above, or as an alternative, further embodiments could include predicting a critical replacement life via at least one of the spall initiation model and the spall propagation model.

In addition to one or more of the features described above, or as an alternative, further embodiments could include that the remaining useful life includes at least one of a remaining useful life value; a remaining useful life distribution; a remaining useful life error band; and a remaining useful life confidence level.

In addition to one or more of the features described above, or as an alternative, further embodiments could include that the usage and configuration information includes a diagnostic usage and configuration information and a forecasted usage and configuration information.

In addition to one or more of the features described above, or as an alternative, further embodiments could include providing the forecasted usage and configuration information via a planning interface.

In addition to one or more of the features described above, or as an alternative, further embodiments could include managing the usage and configuration information to selectively utilize the usage and configuration information.

In addition to one or more of the features described above, or as an alternative, further embodiments could include conditioning the usage and configuration information to remove at least one undesirable value of the usage and configuration information.

In addition to one or more of the features described above, or as an alternative, further embodiments could include that the usage and configuration information includes at least one of a rotational shaft speed, an axial load, and a radial load.

In addition to one or more of the features described above, or as an alternative, further embodiments could include assigning a maintenance schedule utilizing the remaining useful life.

In addition to one or more of the features described above, or as an alternative, further embodiments could include comparing at least one of the spall initiation model and the spall propagation model to a diagnostic remaining useful life associated with the component, and adapting at least one of the spall initiation model and the spall propagation model based on the diagnostic remaining useful life associated with the component.

According to another embodiment, a system for determining a remaining useful life of a component, includes at least one sensor associated with the component to provide a diagnostic usage and configuration information, a planning interface associated with the component to receive a load forecast to provide a future usage and configuration information, an analysis unit to determine if a preexisting spall condition exists for the component by analyzing the diagnostic usage and configuration information, execute a spall initiation model for the component if the preexisting spall condition does not exist, wherein the spall initiation model provides a spall initiation life associated with the component by analyzing the at least one of the diagnostic usage and configuration information and the future usage and configuration information, execute a spall propagation model for the component, wherein the spall propagation model provides a spall propagation life associated with the component by analyzing at least one of the diagnostic usage and configuration information and the future usage and configuration information, and integrating the spall initiation life and the spall propagation life to calculate a remaining useful life, and a maintenance interface to display the remaining useful life.

Technical function of the embodiments described above includes determining if a preexisting spall condition exists for the component, executing a spall initiation model for the component if the preexisting spall condition does not exist, wherein the spall initiation model provides a spall initiation life associated with the component by analyzing the usage and configuration information, executing a spall propagation model for the component, wherein the spall propagation model provides a spall propagation life associated with the component by analyzing the usage and configuration information.

Other aspects, features, and techniques of embodiments will become more apparent from the following description taken in conjunction with the drawings.

BRIEF DESCRIPTION OF THE SEVERAL VIEWS OF THE DRAWINGS

The subject matter, is particularly pointed out and distinctly claimed in the claims at the conclusion of the specification. The foregoing and other features, and advantages of the embodiments are apparent from the following detailed description taken in conjunction with the accompanying drawings in which like elements are numbered alike in the several FIGURES:

DETAILED DESCRIPTION

Figure 1:
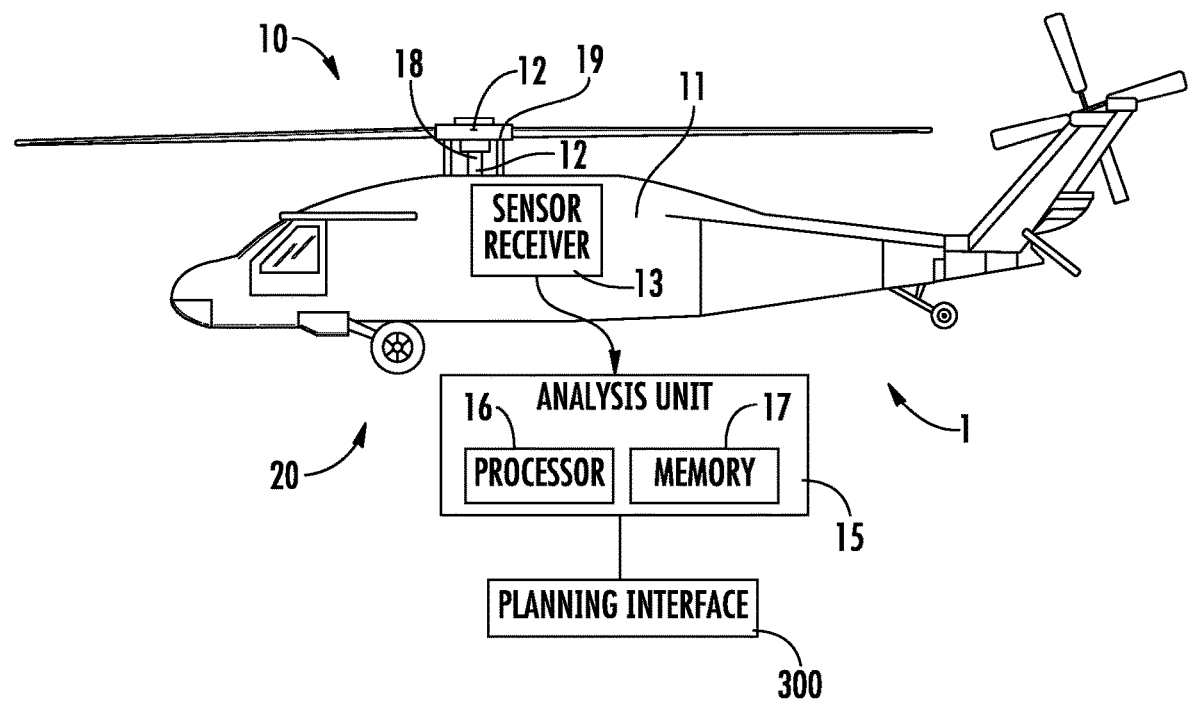
FIG. 1 is a schematic side view of an aircraft in accordance with an embodiment.

FIG. 1 illustrates a general view of an exemplary aircraft in the form of aircraft 1 according to an embodiment. As illustrated in FIG. 1, the aircraft 1 may include a body 11 with rotor blades 10. A plurality of rotor blades 10 are attached to a rotor hub 19. Rotor hub 19 is connected to body 11 via rotor shaft 18. The plurality of rotor blades 10 is driven to rotate about the rotor hub 19. Aircraft 1 can further include rotating components, including, but not limited to rotor hub 19, as well as bearings, gears, etc. In an exemplary embodiment, a plurality of sensors 12 can be disposed throughout the aircraft 1. In an exemplary embodiments, rotating components may be associated with the drivetrain. In certain embodiments, rotating components are subject to wear, degradation and failure, and require maintenance and replacement.

Although a particular configuration of an aircraft 1 is illustrated and described in the disclosed embodiments, it will be appreciated that other configurations and/or machines that may operate in land or water including, rotating machinery, fixed wing aircraft, dual rotor aircraft and rotary-wing aircraft may benefit from embodiments disclosed.

Sensors 12 may be associated with components to monitor loads and conditions exerted upon aircraft 1 and components thereof. In an exemplary embodiment, a plurality of sensors 12 can be disposed in aircraft components, including, but not limited to, the rotor shaft 18, the rotor hub 19, and other suitable rotating components, such as bearings and gears. The sensors 12 may include, for example, strain gauges, magnetic Hall Effect sensors, temperature sensors, pressure sensors, magnetorestrictive sensors, accelerometers, and rate gyros. In the present specification and claims, perturbations in aircraft state result in changes in the loads and motion characteristics of the aircraft components, including, but not limited to, shaft 18, rotor hub 19, and other suitable rotating components, such as bearings and gears, including changes in shaft speed, axial loads, and radial loads.

In an exemplary embodiment, a mission builder 20 interface can be utilized to profile and input future and forecasted usage of aircraft 1. In certain embodiments, these future profiles can be analyzed to determine potential loading and wear of the aircraft 1, both at the aircraft level, as well as at a component level.

In an exemplary embodiment, information regarding component usage can be sent to an analysis unit 15. In an exemplary embodiment, the sensors 12 can transmit data to a sensor receiver 13 associated with the analysis unit 15. In certain embodiments, information regarding aircraft components regarding forecasted use can be input and calculated using a mission builder 20.

In an exemplary embodiment, analysis unit 15 includes a processor 16 to perform and execute the remaining useful life determinations described herein. The analysis unit 15 may further include memory 17, supporting logic, and other circuitry necessary to analyze the sensor data, diagnostic data, and forecast data, and store and transmit the analyzed data. Examples of memory and supporting logic include hard disks, flash memory, volatile and non-volatile memory, field programmable gate arrays, multiplexers, and other memory and logic circuitry. According to one embodiment, the analysis unit 15 is located within the body 11 of the helicopter. In an alternative embodiment, the analysis unit 15 is external to the helicopter.

Figure 2:
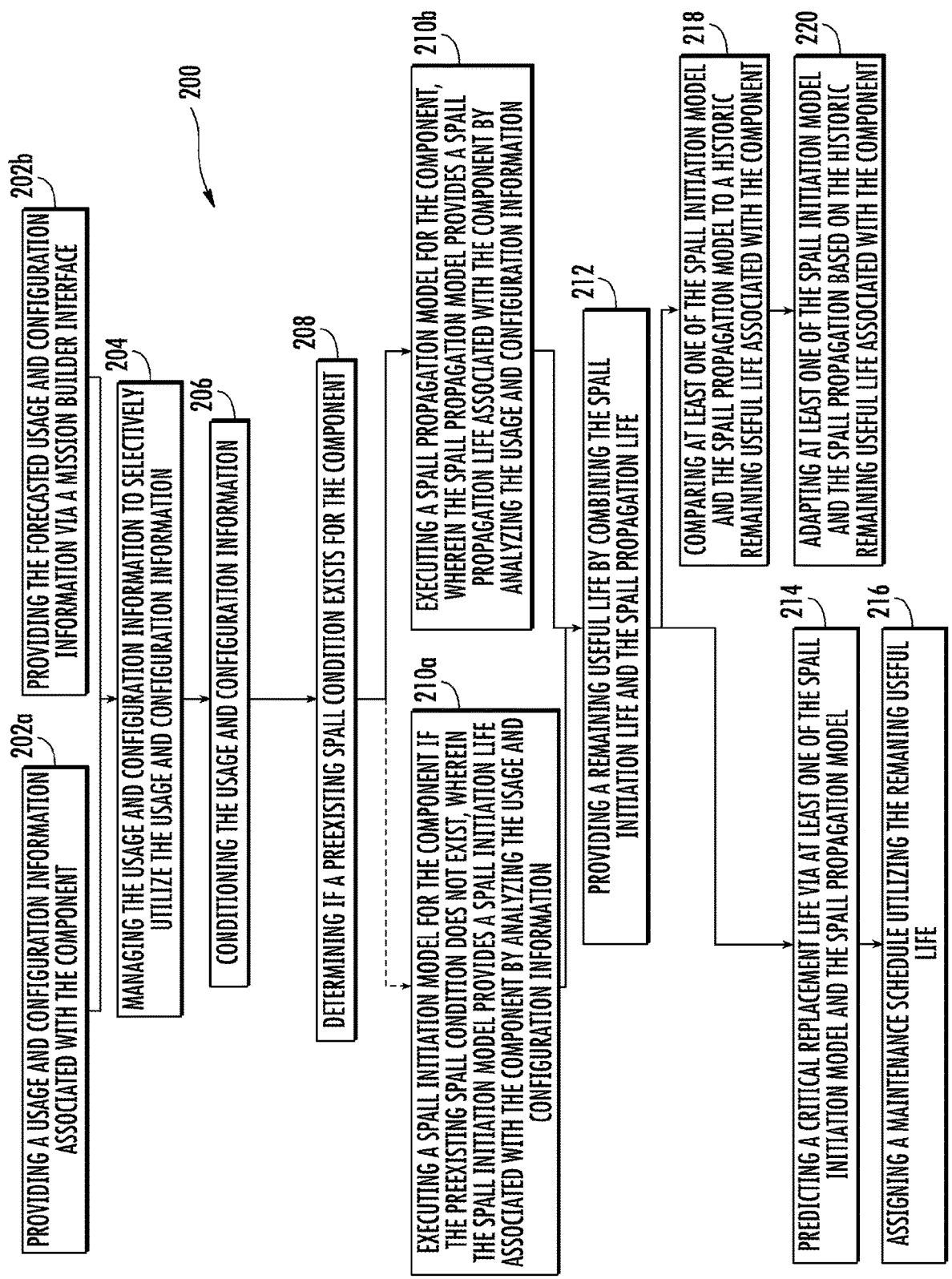
FIG. 2 is a flow diagram of a method of providing a remaining useful life in accordance with an embodiment.

FIG. 2 is a flow chart of a method 200 according to an embodiment. In an exemplary embodiment, method 200 can be performed utilizing analysis unit 15 described above. Although one particular sequence of operations is illustrated, embodiments also correspond to methods in which the operations are performed in an alternative order, in which one or more operations are omitted, or in which alternative operations are added or substituted in the method.

In operation 202a usage and configuration information associated with the component is provided to the analysis unit, such as analysis unit 15 shown in FIG. 1. Usage and configuration information provided can include diagnostic usage and configuration information provided from previous flights and sensor logs, detected fault logs, as well as real time data. In an exemplary embodiment, usage and configuration information can include, but is not limited to, shaft speeds, rotational speeds, axial loads, rotary loads, etc. In certain embodiments, sensor and technician input is utilized to identify spall and other physical damage or component failure modes. If a spall, e.g., is detected, usage and configuration information can include spall size and distribution. In an exemplary embodiment, usage and configuration information can include ranges of uncertainty. Usage and configuration information may be provided from any suitable information source. In an exemplary embodiment, an analysis unit 15 is capable of utilizing information from any suitable platform.

In operation 202b forecasted usage and configuration information is provided via a planning interface 300. The mission builder, such as the mission builder 20 shown in FIG. 1, may be utilized to input forecasted and future flight profiles. The mission builder may provide relevant loads and usage estimates for future flight profiles. In certain embodiments, the usage and configuration information is provided at an aircraft level, while in other embodiments, the usage and configuration information is provided at a component level. Uncertainty regarding the future profiles is calculated and provided to an analysis unit.

In operation 204 the usage and configuration information is managed to remove undesirable data. In certain embodiments, data received from sensors and diagnostic logs can require management prior to analysis. In an exemplary embodiment, usage and configuration information can be managed to remove data outliers, and correct data formatting, while performing data flow and bookkeeping operations.

In operation 206 the usage and configuration information is conditioned. In certain embodiments, usage and configuration information, such as usage and configuration information received from sensors and diagnostic logs, may require conditioning to remove signal noise, unacceptable variance, out of range values, or correction for various operating conditions. In an exemplary embodiment, if usage and configuration information is presented at an aircraft level, usage and configuration information can be determined at the component level utilizing component wear models.

In operation 208 the previous usage and configuration information is analyzed to determine if a preexisting spall condition exists. In an exemplary embodiment, spall condition determinations can be established from provided spall information including spall size and spall distribution. In other embodiments, other provided usage and configuration information is utilized to determine if a spall condition is preexisting before modelling. In an exemplary embodiment, if a determination is made that spall does not previously exist, the spall initiation model described in 210a is executed before executing the spall propagation model described in 210b. In other embodiments, if a determination is made that spall exists on the component to be modeled, the analysis unit only executes the spall propagation model described in 210b. If spall is determined to exist previously, spall size, spall upper bounds, spall lower bounds, and spall distribution are provided to the spall propagation model described in 210b.

In operation 210a the spall initiation model is executed by analyzing past and future-looking usage and configuration information. In alternative embodiments, additional and alternative failure models can be executed by analyzing past and future-looking data to generate and calculate additional failure modes and remaining useful life estimates. In an exemplary embodiment, a spall initiation model utilizes past usage loads, present usage loads, expected usage loads based on mission planning, physics based models and empirical methods to calculate spall and/or fault initiation. The spall initiation model may be any suitable model available for specific components or a general spall initiation model adapted for various components. In certain embodiments, spall initiation models are specific to a target component to be analyzed. In an exemplary embodiment, after a spall initiation is modeled, an initial spall information is provided to a spall propagation model as well as other processes. Initial spall information may include a spall initiation period, which may be in revolutions, an initial spall size, a spall upper bound, a spall lower bound, and a spall distribution. In an exemplary embodiment, uncertainty can be included as well.

In operation 210b the spall propagation model is executed by analyzing past and future-looking usage and configuration information. In an exemplary embodiment, a spall propagation model is executed after an actual component spall is detected or a component spall is modeled in a spall initiation model. In an exemplary embodiment, a spall propagation model utilizes past, present usage loads, expected usage loads based on mission planning, initial spall size, initial spall distribution, physics based models and empirical methods to calculate spall and/or fault propagation. The spall propagation model may be any suitable model available for specific components or a general spall propagation model adapted for various components. In certain embodiments, spall propagation models are specific to a target component to be analyzed. In an exemplary embodiment, the spall propagation model is executed to model spall growth and propagation until a predetermined or technician-selected spall threshold is exceeded. A spall threshold may be considered the threshold wherein the remaining useful life of the component is exceeded and/or does not provide desirable operation. Spall propagation information may include a spall threshold lifetime, which is wherein the minimum, maximum or average spall size exceeds a threshold spall size, wherein the lifetime may be in revolutions. Spall propagation information may further include an average spall size, a spall upper bound, a spall lower bound, and a spall distribution. In an exemplary embodiment, uncertainty can be included as well.

In operation 212 the relevant outputs from at least one of the spall initiation model and the spall propagation model are combined to determine a remaining useful life. In an exemplary embodiment, analysis unit 15 can utilize a life integrator to utilize outputs from the spall initiation model and the spall propagation model to determine a remaining useful life, a remaining useful life probability distribution, error bands (+/− working hours), and confidence levels. In an exemplary embodiment, uncertainty calculations are completed utilizing uncertainty data associated with the usage and configuration information.

In operation 214 the remaining useful life output is utilized to determine a critical replacement time or life for the component. In an exemplary embodiment, the current state of a component is utilized along with the outputs received from the spall initiation model and the spall propagation model to determine or predict a future critical damage state.

In operation 216 a maintenance schedule is determined based on the remaining useful life, calculated uncertainty, maintenance windows, and predicted critical damage states. In an exemplary embodiment, the planning interface 300 is used to determine future profiles, as well as identify and execute an appropriate maintenance schedule. In certain embodiments, the maintenance schedule can be identified and executed by another routine, method, system, or apparatus. Advantageously, by utilizing remaining useful life and critical replacement identification, previously unscheduled maintenance can be scheduled, allowing full component usage compared to replacement in accordance with elapsed operating hours.

Advantageously, results from modelled spall initiation and spall propagation can be compared to diagnostic and empirical results for similar components. In operation 218 the results of the spall initiation model and the spall propagation are compared to diagnostic data. In an exemplary embodiment, model outputs are compared to typical component retirement times. In certain embodiments, upcoming periodic maintenance is compared to actual component states.

In operation 220 the comparisons performed with diagnostic information can be utilized to adapt the spall initiation model and the spall propagation model. Advantageously, such adaptations can improve the modelling accuracy of the spall initiation model and the spall propagation model.

The terminology used herein is for the purpose of describing particular embodiments only and is not intended to be limiting of the embodiments herein. While the description of the present embodiments herein have been presented for purposes of illustration and description, it is not intended to be exhaustive or limited to the embodiments herein in the forms disclosed. For instance, aspects of the embodiments herein are not limited to aircraft, and can be used in other systems with rotary elements. Further, failure modes, models and remaining useful life estimates other than those associated with spalls are contemplated by the embodiments herein. Many modifications, variations, alterations, substitutions or equivalent arrangement not hereto described will be apparent to those of ordinary skill in the art without departing from the scope and spirit of the embodiments herein. Additionally, while the various embodiments have been described, it is to be understood that aspects of the embodiments herein may include only some of the described embodiments. Accordingly, the embodiments herein is not to be seen as limited by the foregoing description, but is only limited by the scope of the appended claims.

What is claimed is:

1. A method for determining a remaining useful life of an aircraft component, comprising:
   providing a usage and configuration information including diagnostic usage and configuration information provided from previous flights and sensor logs, detected fault logs, and/or real time data, such as shaft speeds, rotational speeds, axial loads, rotary loads, spall size, and/or spall distribution associated with the aircraft component;
   determining if a preexisting spall condition exists for the aircraft component based on the usage and configuration information;
   executing a spall initiation model for the aircraft component, the spall initiation model utilizing past usage loads, present usage loads, expected usage loads based on mission planning, physics based models and empirical methods to calculate spall and/or fault initiation model and provide initial spall information including spall initiation period, an initial spall size, a spall upper bound, a spall lower bound, and/or initial spall distribution to a spall propagation model if the preexisting spall condition does not exist, wherein the spall initiation model provides a spall initiation life associated with the aircraft component by analyzing the usage and configuration information;
   executing the spall propagation model for the aircraft component after one of detecting an actual aircraft component spall and an aircraft component spall is modeled in a spall initiation model, the spall proragation model utilizing past usage loads, present usage loads, and/or expected usage loads based on mission planning, initial spall size, initial spall distribution, physics based models and empirical methods to calculate spall and/or fault propagation, wherein the spall propagation model provides a spall propagation life associated with the aircraft component by analyzing the usage and configuration information; and
   providing a remaining useful life by integrating the spall initiation life and the spall propagation life.

2. The method of claim 1, wherein at least one of the spall initiation model and the spall propagation model provides a spall distribution characteristic and a spall size trend characteristic.

3. The method of claim 1, wherein the spall propagation life is determined when the spall distribution characteristic exceeds a threshold spall distribution characteristic.

4. The method of claim 1, further comprising providing an uncertainty range for the remaining useful life.

5. The method of claim 1, further comprising calculating the uncertainty range from the usage and configuration information.

6. The method of claim 1, further comprising predicting a critical replacement life via at least one of the spall initiation model and the spall propagation model.

7. The method of claim 1, wherein the remaining useful life includes at least one of a remaining useful life value; a remaining useful life distribution; a remaining useful life error band; and a remaining useful life confidence level.

8. The method of claim 1, wherein the usage and configuration information includes a diagnostic usage and configuration information and a forecasted usage and configuration information.

9. The method of claim 8, further comprising providing the forecasted usage and configuration information via a planning interface.

10. The method of claim 1, further comprising managing the usage and configuration information to selectively utilize the usage and configuration information.

11. The method of claim 1, further comprising conditioning the usage and configuration information to remove at least one undesirable value of the usage and configuration information, the undesirable value including a data outlier.

12. The method of claim 1, wherein the usage and configuration information includes at least one of a rotational shaft speed, an axial load, and a radial load.

13. The method of claim 1, further comprising assigning a maintenance schedule utilizing the remaining useful life.

14. The method of claim 1, further comprising:
   adapting at least one of the spall initiation model and the spall propagation model based on the diagnostic remaining useful life associated with the component.

15. A system for determining a remaining useful life of an aircraft component, comprising:
   at least one sensor associated with the component to provide a diagnostic usage and configuration information;
   a planning interface associated with the component to receive a load forecast to provide a future usage and configuration information including diagnostic usage and configuration information provided from previous flights and sensor logs, detected fault logs, and/or real time data, such as shaft speeds, rotational speeds, axial loads, rotary loads, spall size, and/or spall distribution;
   an analysis unit to determine if a preexisting spall condition exists for the aircraft component by analyzing the diagnostic usage and configuration information, by executing a spall initiation model for the aircraft component if the preexisting spall condition does not exist, wherein the spall initiation model utilizes past usage loads, present usage loads, expected usage loads based on mission planning, physics based models and empirical methods to calculate spall and/or a fault initiation model and provides initial spall information including spall initiation period, an initial spall size, a spall upper bound, a spall lower bound, and/or initial spall distribution to a spall propagation model and further provides a spall initiation life associated with the aircraft component by analyzing the at least one of the diagnostic usage and configuration information and the future usage and configuration information, and executing a spall propagation model for the aircraft component after one of detecting an actual aircraft component spall and an aircraft component spall is modeled in a spall initiation model, the spall prorogation model utilizing past usage loads, present usage loads, and/or expected usage loads based on mission planning, initial spall size, initial spall distribution, physics based models and empirical methods to calculate spall and/or fault propagation, wherein the spall propagation model provides a spall propagation life associated with the aircraft component by analyzing at least one of the diagnostic usage and configuration information and the future usage and configuration information, and integrating the spall initiation life and the spall propagation life to calculate a remaining useful life; and a maintenance interface to display the remaining useful life.

* * * * *